US012787476B2

(12) United States Patent
Chen et al.

(10) Patent No.: US 12,787,476 B2
(45) Date of Patent: Nov. 3, 2026

(54) SOLAR CELL AND PREPARATION METHOD THEREFOR

(71) Applicant: TONGWEI SOLAR (MEISHAN) CO., LTD., Meishan (CN)

(72) Inventors: Hao Chen, Meishan (CN); Xiupeng Wang, Meishan (CN); Guoqiang Xing, Meishan (CN)

(73) Assignee: TONGWEI SOLAR (MEISHAN) CO., LTD., Meishan (CN)

( * ) Notice: Subject to any disclaimer, the term of this patent is extended or adjusted under 35 U.S.C. 154(b) by 396 days.

(21) Appl. No.: 18/697,328

(22) PCT Filed: Dec. 26, 2022

(86) PCT No.: PCT/CN2022/141804
§ 371 (c)(1),
(2) Date: Mar. 29, 2024

(87) PCT Pub. No.: WO2023/221510
PCT Pub. Date: Nov. 23, 2023

(65) Prior Publication Data
US 2024/0290907 A1 Aug. 29, 2024

(30) Foreign Application Priority Data
May 19, 2022 (CN) ......................... 202210554893.9

(51) Int. Cl.
*H10F 71/10* (2025.01)
*H10F 77/122* (2025.01)
*H10F 77/164* (2025.01)

(52) U.S. Cl.
CPC ........... *H10F 71/10* (2025.01); *H10F 71/103* (2025.01); *H10F 77/122* (2025.01); *H10F 77/1642* (2025.01)

(58) Field of Classification Search
CPC ...... H10F 71/10; H10F 71/103; H10F 77/122; H10F 77/1642; H10F 71/121;
(Continued)

(56) References Cited

U.S. PATENT DOCUMENTS 5,200,630 A * 4/1993 Nakamura ......... H10D 30/6743 257/66
2012/0202315 A1 8/2012 Whitesell et al.

FOREIGN PATENT DOCUMENTS

CN 103258919 A 8/2013
CN 106571306 A * 4/2017 .......... H10P 14/3411
(Continued)

OTHER PUBLICATIONS

Machine translation of CN 106571306 A (Year: 2017).*
(Continued)

*Primary Examiner* — Angelo Trivisonno
(74) *Attorney, Agent, or Firm* — Dority & Manning, PA

(57) ABSTRACT

In one aspect, a preparation method for a solar cell includes: forming a target amorphous silicon layer on a side of a silicon wafer using a preset process, and then performing an annealing treatment on the target amorphous silicon layer to convert the target amorphous silicon layer into a target polycrystalline silicon layer, wherein the preset process includes at least one cycle period, the at least one cycle period comprises: depositing a target amorphous silicon preformed layer with a preset thickness and performing a hydrogen gas plasma treatment on the target amorphous silicon preformed layer, wherein the preset thickness of the target amorphous silicon preformed layer is less than or equal to a thickness of the target amorphous silicon layer. This method can effectively improve a crystallization rate of
(Continued)

converting amorphous silicon into polycrystalline silicon, improving field passivation performance and contact performance of the solar cell.

17 Claims, 1 Drawing Sheet

(58) Field of Classification Search
CPC .... H10F 71/128; H10F 71/129; H10F 10/165; H10F 77/311; H10F 10/14; Y02P 70/50
See application file for complete search history.

(56) References Cited

FOREIGN PATENT DOCUMENTS

| | | | |
|---|---|---|---|
| CN | 106653572 | A | 5/2017 |
| CN | 109411551 | A | 3/2019 |
| CN | 110459651 | A | 11/2019 |
| CN | 110767774 | A | 2/2020 |
| CN | 111200038 | A | 5/2020 |
| CN | 111326606 | A | 6/2020 |
| CN | 111725350 | A | 9/2020 |
| CN | 113972302 | A | 1/2022 |
| CN | 114864751 | A | 8/2022 |
| EP | 2656401 | B1 | 10/2013 |
| JP | H04252018 | A | 9/1992 |
| JP | H07335660 | A | 12/1995 |
| JP | H0888172 | A | 4/1996 |
| JP | H0927627 | A | 1/1997 |
| JP | 2005093986 | A | 4/2005 |
| JP | 2014072406 | A | 4/2014 |
| JP | 2015056499 | A | 3/2015 |
| KR | 19990050318 | A | 7/1999 |
| KR | 20180045587 | A | 5/2018 |

OTHER PUBLICATIONS

International Search Report and Written Opinion (w/ English translations) for corresponding Application No. PCT/CN2022/141804, dated Mar. 8, 2023, 14 pages.

Sriraman et al., "Letters to Nature: Mechanism of hydrogen-induced crystallization of amorphous silicon", Nature Publishing Group, vol. 418, University of California, USA, Jul. 2002, pp. 62-65.

Sriraman et al., "Hydrogen-induced crystallization of amorphous silicon thin films. I. Simulation and analysis of film postgrowth treatment with H2 plasmas", Article, Journal of Applied Physics, vol. 100, 053514, Sep. 2006, 12 pages.

Chinese Search Report for corresponding Application No. 2022105548939, dated May 25, 2023, 4 pages.

Extended European Search Report for corresponding Application No. 22942530.1, dated Sep. 11, 2024, 11 pages.

Lozac'h, "Roles of hydrogen atoms in p-type Poly-Si/SiOx passivation layer for crystalline silicon solar cell applications", Japanese Journal of Applied Physics 58 05091, 2019, 6 pages.

Polzin, "Thermal activation of hydrogen for defect passivation in poly-Si based passivating contacts", Solar Energy Materials and Solar Cells 230 111267, 2021, 7 pages.

* cited by examiner

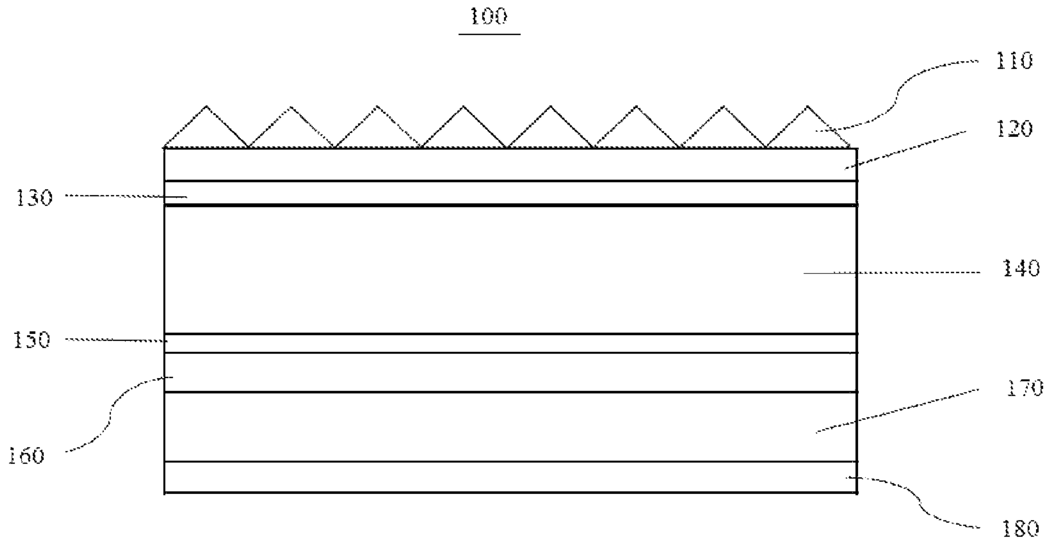
100
110
120
130
140
150
160
170
180

SOLAR CELL AND PREPARATION METHOD THEREFOR

CROSS-REFERENCE TO RELATED APPLICATIONS

This application is a U.S. national phase application under 35 U.S.C. § 371 based upon International Patent Application No. PCT/CN2022/141804, filed on Dec. 26, 2022, which itself priority to Chinese Patent Application No. 202210554893.9, filed on May 19, 2022 with China National Intellectual Property Administration, entitled "SOLAR CELL AND PREPARATION METHOD THEREFOR", the content of which is hereby incorporated by reference in its entirety.

TECHNICAL FIELD

The present disclosure relates to the technical field of solar cells, and in particular, to a solar cell and a method for preparing a solar cell.

BACKGROUND

Compared with other conventional solar cells, an N-type tunnel oxide passivating contact (TOPCon) cell can significantly improve a photoelectric conversion efficiency of cells. At present, they already occupy a certain market share and have extremely high industrialization prospect.

Currently, in a large-scale production process of TOPCon cells, a main route is to deposit a tunneling oxide layer and an amorphous silicon layer using a tubular PECVD (plasma enhanced chemical vapor deposition method) or a plate-type PVD (plasma enhanced physical vapor deposition method), and convert the amorphous silicon layer into a polycrystalline silicon layer by annealing under a high temperature.

In the foregoing production route, it is difficult to convert the grown amorphous silicon into polycrystalline silicon in an annealing process, which affects field passivation performance and contact performance of the solar cell.

SUMMARY

The present disclosure provides a solar cell and a preparation method thereof, it can effectively improve a crystallization rate of converting amorphous silicon into polycrystalline silicon, thereby improving field passivation performance and contact performance of the solar cell.

The embodiments of the present disclosure are implemented as below.

In a first aspect, the present disclosure provides a method for preparing a solar cell. The method includes: forming a target amorphous silicon layer on a side of a silicon wafer using a preset process, and then performing an annealing treatment on the target amorphous silicon layer to convert the target amorphous silicon layer into a target polycrystalline silicon layer, wherein the preset process includes at least one cycle period, the at least one cycle period comprises: depositing a target amorphous silicon preformed layer with a preset thickness and performing a hydrogen gas plasma treatment on the target amorphous silicon preformed layer, wherein the preset thickness of the target amorphous silicon preformed layer is less than or equal to a thickness of the target amorphous silicon layer.

In some optional embodiments, the method includes: first growing a tunneling oxide layer on the back side of the silicon wafer; forming an intrinsic amorphous silicon layer on a surface of the tunneling oxide layer using the preset process; forming an N-type doped amorphous silicon layer on a surface of the intrinsic amorphous silicon layer; and performing the annealing treatment.

In some optional embodiments, in a step of forming the intrinsic amorphous silicon layer on the surface of the tunneling oxide layer using the preset process, at least one of the following conditions (a) and (b) is met: (a) the preset process includes a plurality of cycle periods, the number of the plurality of cycle periods is in a range of 1 to 10, optionally, the number of the plurality of cycle periods is in a range of 2 to 10; and (b) a thickness of the intrinsic amorphous silicon layer is less than or equal to 50 nm, and a preset thickness of the intrinsic amorphous silicon preformed layer is in a range of 2 nm to 50 nm; optionally, the preset thickness of the intrinsic amorphous silicon preformed layer is in a range of 2 nm to 10 nm.

In some optional embodiments, in the step of forming the intrinsic amorphous silicon layer on the surface of the tunneling oxide layer using the preset process, the following condition is met: the number of the plurality of cycle periods is in a range of 5 to 10, the thickness of the intrinsic amorphous silicon layer is in a range of 20 nm to 50 nm, and the preset thickness of the intrinsic amorphous silicon preformed layer is in a range of 2 nm to 4 nm.

In some optional embodiments, a step of forming the N-type doped amorphous silicon layer on the surface of the intrinsic amorphous silicon layer includes: forming the N-type doped amorphous silicon layer on the surface of the intrinsic amorphous silicon layer using the preset process.

In some optional embodiments, in the step of forming the N-type doped amorphous silicon layer on the surface of the intrinsic amorphous silicon layer using the preset process, at least one of the following conditions (a) and (b) is met: (a) the preset process includes a plurality of cycle periods, the number of the plurality of cycle periods is in a range of 1 to 20, optionally, the number of the plurality of cycle periods is in a range of 2 to 20; and (b) a thickness of the N-type doped amorphous silicon layer is less than or equal to 200 nm, a preset thickness of an N-type doped amorphous silicon preformed layer is in a range of 2 nm to 200 nm; and optionally, the thickness of the N-type doped amorphous silicon layer is in a range of 10 nm to 200 nm, and the preset thickness of the N-type doped amorphous silicon preformed layer is in a range of 2 nm to 10 nm.

In some optional embodiments, in the step of forming the N-type doped amorphous silicon layer on the surface of the intrinsic amorphous silicon layer using the preset process, the following condition is met: the number of the plurality of cycle periods is in a range of 10 to 20, the thickness of the N-type doped amorphous silicon layer is in a range of 100 nm to 200 nm, and the preset thickness of the N-type doped amorphous silicon preformed layer is in a range of 5 nm to 10 nm.

In some optional embodiments, after a step of forming the N-type doped amorphous silicon layer and before performing the annealing treatment, the method further includes: growing a $SiO_x$ mask layer on a surface of the N-type doped amorphous silicon layer.

In some optional embodiments, in a step of forming the target amorphous silicon layer on the back side of the silicon wafer using the preset process, the following condition is met: in a step of performing the hydrogen gas plasma treatment on the target amorphous silicon preformed layer, a flow rate of hydrogen gas is greater than and equal to 1000 sccm, and a treatment time is in a range of 10 s to 60 s; and optionally, the flow rate of hydrogen gas is in a range of 5000 sccm to 8000 sccm, and a treatment time is in a range of 20 s to 30 s.

In some optional embodiments, in the step of forming the target amorphous silicon layer on the back side of the silicon wafer using the preset process, the following condition is met: the at least one cycle period of the preset process includes: depositing the target amorphous silicon preformed layer with the preset thickness using a plasma enhanced chemical vapor deposition method or a plasma enhanced physical vapor deposition method.

In some optional embodiments, a step of growing the tunneling oxide layer on the back side of the silicon wafer further includes: growing the tunneling oxide layer with a thickness of 0.5 nm to 2 nm on the back side of the silicon wafer using a plasma enhanced chemical vapor deposition method or a plasma enhanced atomic layer deposition method.

In some optional embodiments, a step of forming the intrinsic amorphous silicon layer on the surface of the tunneling oxide layer using the preset process further includes: first introducing $SiH_4$ and $H_2$ using a plasma enhanced chemical vapor deposition method, depositing an intrinsic amorphous silicon film, then stopping introducing $SiH_4$ and $H_2$ and vacuuming; and performing a hydrogen gas plasma treatment by introducing $H_2$ and then vacuuming after the treatment; and repeating the above steps to obtain the intrinsic amorphous silicon layer.

In some optional embodiments, a step of forming the N-type doped amorphous silicon layer on the surface of the intrinsic amorphous silicon layer includes: first introducing $SiH_4$, $NH_3$, and $H_2$, depositing an N-type doped amorphous silicon film using a plasma enhanced chemical vapor deposition method, and then stopping introducing $SiH_4$, $NH_3$, and $H_2$ and vacuuming; performing a hydrogen gas plasma treatment by introducing $H_2$ and then vacuuming after the treatment; and repeating the above steps to obtain the N-doped amorphous silicon layer In some optional embodiments, a step of performing an annealing treatment includes performing an annealing treatment using a tubular annealing furnace to convert the target amorphous silicon layer into the target polycrystalline silicon layer, wherein an annealing gas atmosphere is nitrogen or oxygen, an annealing temperature is in a range of 600° C. to 1000° C., and an annealing time is in a range of 10 min to 60 min.

In some optional embodiments, the preset process includes a plurality of cycle periods, and the preset thickness of the target amorphous silicon preformed layer in each of the plurality of cycle periods is the same.

In some optional embodiments, the preset process includes a plurality of cycle periods, and the preset thickness of the target amorphous silicon preformed layer in each of the plurality of cycle periods is different.

In a second aspect, the present disclosure further provides a solar cell prepared by the above method.

The solar cell and the preparation method thereof in the present disclosure have following advantages:

the method includes forming an amorphous silicon layer by using a preset process, and then performing an annealing treatment to convert the amorphous silicon layer into a polycrystalline silicon layer. In the preset process, after depositing a target amorphous silicon preformed layer with a preset thickness, a hydrogen gas plasma treatment is performed on the target amorphous silicon preformed layer, which can improve a disordered microstructure in the deposited target amorphous silicon preformed layer, thereby effectively improving a crystallization rate of converting amorphous silicon into polycrystalline silicon, improving field passivation performance and contact performance of the solar cell, and further improving an open circuit voltage (Voc) and a fill factor (FF) of the solar cell effectively.

In the preset process, at least one cycle period is designed. When the preset process includes a plurality of cycle periods, to form a target amorphous silicon layer, deposition of the target amorphous silicon layer is interrupted for a plurality of times and a hydrogen gas plasma treatment is performed, which facilitates more hydrogen atoms entering the amorphous silicon, and can better combine a hydrogen atom with a suspended bond, and better improve a disordered microstructure in the amorphous silicon.

In an embodiment in which an intrinsic amorphous silicon layer is formed on a surface of the tunneling oxide layer using the preset process, when the hydrogen gas plasma treatment is performed on the intrinsic amorphous silicon layer, hydrogen atoms can also easily enter an interface between a silicon wafer and a tunneling oxide layer, so that a large quantity of silicon suspension bonds at the interface can be saturated, thereby improving passivation performance of the solar cell and further improving an open circuit voltage (Voc) and a fill factor (FF) of the solar cell effectively.

BRIEF DESCRIPTION OF THE DRAWINGS

To describe the technical solutions of the embodiments of present disclosure more clearly, the following briefly describes the accompanying drawings required for describing the embodiments. It should be understood that the following accompanying drawings show only some embodiments of the present disclosure. Therefore, the accompanying drawings should not be considered as a limitation on a scope. A person of ordinary skill in the art may still derive other related drawings from these accompanying drawings without creative efforts.

FIG. 1 is a schematic structural diagram of a solar cell according to an embodiment of the present disclosure.

Reference signs: 100 represents a solar cell, 110 represents a front anti-reflection layer, 120 represents a front passivation layer; 130 represents a front P-type doped layer, 140 represents a silicon wafer; 150 represents a tunneling oxide layer; 160 represents an intrinsic amorphous silicon layer, 170 represents phosphorus-doped polycrystalline silicon layer; and 180 represents a back passivation layer.

DETAILED DESCRIPTION

To make the objectives, technical solutions, and advantages of the embodiments of the present disclosure clearer, the following clearly and completely describes the technical solutions in the embodiments of the present disclosure. If a specific condition is not specified in the embodiment, the condition is performed according to the conventional condition or the condition recommended by the manufacturer. If the reagent or instrument used is not specified by the manufacturer, it is a regular product available for commercial purchase.

It should be noted that, in the description of the present disclosure, unless otherwise noted, “multiple” in “one or more” means two or more; the range of “value a to value b” includes the values “a” and “b” at both ends. The “unit of measure” in “value a to value b and unit of measure” represents the “unit of measure” of “value a” and “value b”.

The solar cell and the preparation method thereof in the embodiments of the present disclosure will be described as following.

It is found by inventors that currently, in a process of growing an amorphous silicon layer by using a tubular PECVD or a plate-type PVD, a microstructure of amorphous silicon obtained by depositing is disordered, so that it is difficult to convert amorphous silicon into polycrystalline silicon in an annealing treatment. In addition, when a tunneling oxide layer is formed on a surface of the silicon wafer by using a tubular PECVD or a plate-type PVD, plasma bombardment on the surface of the silicon wafer causes serious damage to a bonding state of silicon on the surface of the silicon wafer, resulting in a large quantity of silicon suspension bonds, resulting in poor chemical passivation performance of the solar cell, and consequently, decreasing of the Voc of the solar cell.

Based on this, it is further found that, in a step of growing an amorphous silicon layer, hydrogen gas is introduced to treat the amorphous silicon by using a hydrogen gas plasma, and hydrogen atomic energy can be combined with a suspended bond in the amorphous silicon, thereby improving a disordered microstructure in depositing the amorphous silicon, thereby effectively improving a crystallization rate of converting amorphous silicon into polycrystalline silicon. In addition, when the intrinsic amorphous silicon layer is formed on the surface of the tunneling oxide layer, the intrinsic amorphous silicon is processed a treatment using a hydrogen gas plasma, and the hydrogen atom can also easily enter an interface between the silicon wafer and the tunneling oxide layer, so that a large quantity of silicon suspended bonds at the interface can be saturated.

In a first aspect, based on the foregoing study, an embodiment of the present disclosure provides a method for preparing a solar cell. The method includes: forming a target amorphous silicon layer on a side of a silicon wafer using a preset process, and then performing an annealing treatment on the target amorphous silicon layer to convert the target amorphous silicon layer into a target polycrystalline silicon layer.

The preset process includes at least one cycle period.

The cycle period includes: depositing a target amorphous silicon preformed layer with a preset thickness and performing a hydrogen gas plasma treatment on the target amorphous silicon preformed layer, wherein the preset thickness of the target amorphous silicon preformed layer is less than or equal to a thickness of the target amorphous silicon layer.

In the embodiments of the present disclosure, the target amorphous silicon layer is an intrinsic amorphous silicon layer, an N-type doped amorphous silicon layer, a P-type doped amorphous silicon layer, etc. In a solar cell, one target amorphous silicon layer or multiple different target amorphous silicon layers may be formed using the preset process.

The preset process of forming each target amorphous silicon layer includes one or a plurality of cycle periods.

The target amorphous silicon and the target polycrystalline silicon respectively refer to amorphous silicon and polycrystalline silicon that are respectively corresponding to a material of the target amorphous silicon layer and a material of the target polycrystalline silicon layer. In the preset process of forming each target amorphous silicon layer, the preset process includes a plurality of cycle periods, the preset thickness of the target amorphous silicon preformed layer in each of the plurality of cycle periods can be the same or different. In an embodiment, the preset thickness of the target amorphous silicon preformed layer in each of the plurality of cycle periods is the same.

The method for preparing the solar cell in the embodiments of the present disclosure includes forming an amorphous silicon layer by using a preset process, and then performing an annealing treatment to convert the amorphous silicon layer into a polycrystalline silicon layer. In the preset process, after depositing a target amorphous silicon preformed layer with a preset thickness, a hydrogen gas plasma treatment is performed on the target amorphous silicon preformed layer, which can improve a disordered microstructure in the deposited target amorphous silicon preformed layer, thereby effectively improving a crystallization rate of converting amorphous silicon into polycrystalline silicon, improving field passivation performance and contact performance of the solar cell, and further improving an open circuit voltage (Voc) and a fill factor (FF) of the solar cell effectively.

In the preset process, at least one cycle period is designed. When the preset process includes a plurality of cycle periods, to form a target amorphous silicon layer, deposition of the target amorphous silicon layer is interrupted for a plurality of times and a hydrogen gas plasma treatment is performed, which facilitates more hydrogen atoms entering the amorphous silicon, and can better combine a hydrogen atom with a suspended bond, and better improve a disordered microstructure in the amorphous silicon.

Considering that in related art, an amorphous silicon layer is formed using a tubular PECVD or a plate-type PVD, a microstructure of the deposited amorphous silicon is disordered, and it is difficult to convert amorphous silicon into polycrystalline silicon in an annealing treatment. However, such problem can be effectively solved by using the preset process in this embodiment of the present disclosure; in addition, in a process of growing an amorphous silicon layer by using a tubular PECVD or a plate-type PVD, wraparound deposition can be reduced, which helps control an appearance and a good rate of the solar cell.

In some embodiments, in a step of forming the target amorphous silicon layer on the back side of the silicon wafer by using the preset process, the following condition is met: depositing the target amorphous silicon preformed layer with the preset thickness by a plasma enhanced chemical vapor deposition method or a plasma enhanced physical vapor deposition method.

Furthermore, in some embodiments, the method includes: first growing a tunneling oxide layer on the back side of the silicon wafer; forming an intrinsic amorphous silicon layer on a surface of the tunneling oxide layer using the preset process; forming an N-type doped amorphous silicon layer on a surface of the intrinsic amorphous silicon layer; and performing the annealing treatment.

The intrinsic amorphous silicon layer is formed by the preset process. Another amorphous silicon layer other than the intrinsic amorphous silicon layer, such as an N-type doped amorphous silicon layer, may be formed by the preset process, or may be formed in a conventional deposition manner.

In an embodiment, an N-type doped amorphous silicon layer is formed on a surface of the intrinsic amorphous silicon layer by the preset process.

The amorphous silicon layer is formed by the preset process, and the obtained amorphous silicon layer can be better converted into a polycrystalline silicon layer. In addition, in an embodiment in which the intrinsic amorphous silicon layer is formed on the surface of the tunneling oxide layer by the preset process, when a hydrogen gas plasma treatment is performed on the intrinsic amorphous silicon, hydrogen atoms can also easily enter an interface between the silicon wafer and the tunneling oxide layer, so that a large quantity of silicon suspension bonds at the interface can be saturated, thereby improving passivation performance of the solar cell and further improving Voc of the solar cell effectively.

To better achieve a hydrogen plasma treatment effect, parameters in the preset process are described as below.

In a step of forming the target amorphous silicon layer on the back side of the silicon wafer by the preset process, the following conditions are met: when performing a hydrogen gas plasma treatment on the target amorphous silicon preformed layer, a flow rate of hydrogen gas is greater than or equal to 1000 sccm, for example, but not limited to 1000 sccm, 2000 sccm, 3000 sccm, 4000 sccm, 5000 sccm, 6000 sccm, 7000 sccm, 8000 sccm, 9000 sccm, 10000 sccm, and any value which is greater than or equal to 1000 sccm; and a processing time is in a range of 10 s to 60 s, for example, but is not limited to, 10 s, 20 s, 30 s, 40 s, 50 s, 60 s, and any value in the range of 10 s to 60 s.

In an embodiment, a flow rate of hydrogen gas may be in a range of 5000 sccm to 8000 sccm and the processing time may be a range of 20 s to 30 s.

In a step of forming the intrinsic amorphous silicon layer on the surface of the tunneling oxide layer by the preset process, the following conditions are met: the number of cycle periods is in a range of 1 to 10, optionally, the number of the cycle periods is in a range of 2 to 10, for example, but is not limited to 1, 2, 3, 4, 5, 6, 7, 8, 9, or 10.

In some embodiments, a thickness of the intrinsic amorphous silicon layer is less than or equal to 50 nm, such as but not limited to 10 nm, 20 nm, 30 nm, 40 nm and 50 nm or any values which is less than or equal to 50 nm; a preset thickness of the intrinsic amorphous silicon preformed layer is in a range of 2 nm to 50 nm, optionally, the preset thickness of the intrinsic amorphous silicon preformed layer is in a range of 2 nm to 10 nm; for example, a preset thickness of the intrinsic amorphous silicon preformed layer can be, but not limited to 2 nm, 3 nm, 4 nm, 5 nm, 6 nm, 7 nm, 8 nm, 9 nm, 10 nm, 20 nm, 30 nm, 40 nm, 50 nm or any values in the range.

In an embodiment, the step of forming the intrinsic amorphous silicon layer on the surface of the tunneling oxide layer by the preset process has the following conditions: the number of the cycle periods is in a range of 5 to 10, a thickness of the intrinsic amorphous silicon layer may be in a range of 20 nm to 50 nm, and the preset thickness of the intrinsic amorphous silicon preformed layer is in a range of 2 nm to 4 nm.

In some embodiments, a process of forming an N-doped amorphous silicon layer on the surface of the intrinsic amorphous silicon layer by the preset process includes the following conditions: the number of the cycle periods is in a range of 1 to 20, optionally, the number of the cycle periods is in a range of 2 to 20. For example, the number of the cycle periods can be, but not limited to 1, 2, 3, 4, 5, 6, 7, 8, 9, 10, 11, 12, 13, 14, 15, 16, 17, 18, 19, or 20.

In some embodiments, a step of forming the N-type doped amorphous silicon layer on the surface of the intrinsic amorphous silicon layer by the preset process includes the following conditions: a thickness of the N-type doped amorphous silicon layer is less than or equal to 200 nm, optionally, in a range of 10 nm to 200 nm, for example, the thickness of the N-type doped amorphous silicon layer may be, but is not limited to 10 nm, 20 nm, 30 nm, 40 nm, 50 nm, 80 nm, 100 nm, 110 nm, 120 nm, 130 nm, 140 nm, 150 nm, 160 nm, 170 nm, 180 nm, 190 nm, 200 nm, or any value which is less than or equal to 200 nm; a preset thickness of an N-type doped amorphous silicon preformed layer is in a range of 2 nm to 200 nm, optionally, in a range of 2 nm to 10 nm, for example, the preset thickness of the N-type doped amorphous silicon preformed layer can be, but is not limited to 2 nm, 3 nm, 4 nm, 5 nm, 6 nm, 7 nm, 8 nm, 9 nm, 10 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm or any values in the range.

In an embodiment, a step of forming an N-type doped amorphous silicon layer on the surface of the intrinsic amorphous silicon layer by the preset process includes the following conditions: the number of the cycle periods is in a range of 10 to 20, a thickness of the N-type doped amorphous silicon layer is in a range of 100 nm to 200 nm, and the preset thickness of the N-type doped amorphous silicon preformed layer is 5 nm to 10 nm.

It should be noted that in the embodiments of the present disclosure, the method may further include another steps as required.

In some embodiments, after forming the N-type doped amorphous silicon layer and before performing the annealing treatment, the method further includes: growing a $SiO_x$ mask layer on a surface of the N-type doped amorphous silicon layer.

The $SiO_x$ mask layer is configured to protect a back field passivation structure, which can effectively avoid destruction of the back field passivation structure in a subsequent process such as de-wraparound deposition cleaning.

In some embodiments, the method provided in the embodiments of the present disclosure is used to prepare a solar cell 100 as shown in FIG. 1.

Referring to FIG. 1, the solar cell 100 includes a front anti-reflection layer 110, a front passivation layer 120, a front P-type doped layer 130, an N-type silicon wafer 140, a tunneling oxide layer 150, an intrinsic polycrystalline silicon layer 160, a phosphorus-doped polycrystalline silicon layer 170, and a back passivation layer 180 arranged in sequence.

Optionally, the front anti-reflection layer 110 can be a $SiN_x$ anti-reflection, the front passivation layer 120 may be an $AlO_x$ passivation layer, and the back passivation layer 180 can be a $SiN_x$ passivation layer.

The method for preparing the solar cell 100 shown in FIG. 1 includes the following steps:

- S1, texturing: preparing an N-type silicon wafer, texturing the silicon wafer by an alkaline liquid with a concentration of 1% by mass and cleaning the silicon wafer by a hydrogen peroxide solution and an alkaline liquid;
- S2, boron diffusion: putting the silicon wafer into a boron diffusion furnace and achieving boron diffusion by introducing $BCl_3$ at a temperature of 1000° C., to form P-N junction.
- S3, alkaline pickling: removing wraparound BSG formed in the boron diffusion from the back side of the silicon wafer using a chain HF machine, and then using a robot to transfer the silicon wafer to a slot alkali throwing machine to remove P-N junctions on the back side and edge of the silicon wafer;
- S4, forming a tunneling oxide layer on the back side of the silicon wafer: forming a tunneling oxide layer with a thickness in a range of 0.5 nm to 2 nm on the back side of the silicon wafer by a PECVD method or a PEALD (plasma enhanced atomic layer deposition) method;
- S5, forming the intrinsic amorphous silicon layer on the surface of the tunneling oxide layer using a preset process: first introducing $SiH_4$ and $H_2$ using a PECVD method, depositing an intrinsic amorphous silicon preformed layer then stopping introducing $SiH_4$ and $H_2$ and vacuuming; performing a hydrogen gas plasma treatment on the intrinsic amorphous silicon preformed layer and then vacuuming after the treatment; and repeating the above steps to obtain the intrinsic amorphous silicon layer;

S6, forming the N-type doped amorphous silicon layer on the surface of the intrinsic amorphous silicon layer using a preset process: first introducing $SiH_4$, $NH_3$, and $H_2$, depositing an N-type doped amorphous silicon preformed layer using a PECVD method, and then stopping introducing $SiH_4$, $NH_3$, and $H_2$ and vacuuming; performing a hydrogen gas plasma treatment on the N-type doped amorphous silicon preformed layer and then vacuuming after the treatment; and repeating the above steps to obtain the N-doped amorphous silicon layer.

S7, forming a $SiO_x$ mask layer on a surface of the N-type doped amorphous silicon layer: introducing $SiH_4$ and $N_2O$ and depositing a $SiO_x$ mask layer with a thickness of 10 nm to 50 nm using a PECVD method;

S8, annealing treatment: performing an annealing treatment using a tubular annealing furnace to convert the target amorphous silicon layer into the target polycrystalline silicon layer, wherein an annealing gas atmosphere is nitrogen or oxygen, an annealing temperature is in a range of 600° C. to 1000° C., and an annealing time is in a range of 10 min to 60 min;

S9, RCA cleaning: using a chain HF machine to remove wraparound oxide layer on the front side of the silicon wafer during the deposition of steps S4 to S7 and an oxide layer formed during annealing of step S8, and then using an alkali pickling machine to remove a wraparound deposition layer on the front side of the silicon wafer;

S10, depositing an aluminum oxide film and a silicon nitride film on the front side of the silicon wafer: depositing an aluminum oxide ($AlO_x$) film by a PEALD method or a PECVD method for passivation, and an silicon nitride ($SiN_x$) film by a PECVD method for anti-reflection;

S11, depositing a silicon nitride film on the back side by PECVD: depositing a $SiN_x$ film by PECVD and the $SiN_x$ film being used for hydrogen passivation on the back side;

S12, preparing electrodes: screen-printing a slurry on the front side and the back side of the silicon wafer to form electrodes; and S13, electric injection, testing a conversion efficiency and sorting.

S10, The front aluminum oxide film and the silicon nitride film may be deposited in a PEALD manner or a PECVD manner, so as to be passivated. A silicon nitride ($SiN_x$) film may be deposited by using a PECVD for reflection reduction.

In a second aspect, an embodiment of the present disclosure provides a solar cell, prepared by the method of the present disclosure in the first aspect.

The features and performance of the present disclosure are further described in detail below with reference to the examples.

Example 1

This example provides a method for preparing a solar cell for passivation contact includes:

S1, texturing: preparing an N-type silicon wafer, texturing the silicon wafer by an alkaline liquid with a concentration of 1% by mass and cleaning the silicon wafer by a hydrogen peroxide solution and an alkaline liquid;

S2, boron diffusion: putting the silicon wafer into a boron diffusion furnace and achieving boron diffusion by introducing $BCl_3$ at a temperature of 1000° C., to form P-N junction.

S3, alkaline pickling: removing wraparound BSG formed in the boron diffusion from a back side of the silicon wafer using a chain HF machine, and then using a robot to transfer the silicon wafer to a slot alkali throwing machine to remove P-N junctions on the back side and edge of the silicon wafer;

S4, forming a tunneling oxide layer on the back side of the silicon wafer: introducing a silicon source and $O_2$ and forming a tunneling oxide layer ($SiO_x$) with a thickness of 1 nm on the back side of the silicon wafer by a PEALD (plasma enhanced atomic layer deposition) method;

S5, forming an intrinsic amorphous silicon layer on the surface of the tunneling oxide layer using a preset process: first introducing $SiH_4$ and $H_2$ by a PECVD method, depositing an intrinsic amorphous silicon preformed layer with a thickness of 2 nm, then stopping introducing $SiH_4$ and $H_2$ and vacuuming; performing a hydrogen gas plasma treatment on the intrinsic amorphous silicon preformed layer for 20 seconds by introducing $H_2$ with a flow rate of 8000 sccm and then vacuuming after the treatment; and repeating the above steps for 10 times to obtain the intrinsic amorphous silicon layer with a thickness of 20 nm;

S6, forming the N-type doped amorphous silicon layer on a surface of the intrinsic amorphous silicon layer using a preset process: first introducing $SiH_4$, $PH_3$, and $H_2$, depositing an N-type doped amorphous silicon preformed layer with a thickness of 5 nm by a PECVD method, and then stopping introducing $SiH_4$, $PH_3$, and $H_2$ and vacuuming; performing a hydrogen gas plasma treatment on the N-type doped amorphous silicon preformed layer for 20 seconds by introducing $H_2$ with a flow rate of 8000 sccm and then vacuuming after the treatment; and repeating the above steps for 20 times to obtain the N-doped amorphous silicon layer with a thickness of 100 nm.

S7, forming a $SiO_x$ mask layer on a surface of the N-type doped amorphous silicon layer: introducing $SiH_4$ and $N_2O$ and depositing a $SiO_x$ mask layer with a thickness of 20 nm by a PECVD method;

S8, annealing treatment: performing an annealing treatment using a tubular annealing furnace to convert the target amorphous silicon layer into the target polycrystalline silicon layer, wherein an annealing gas atmosphere is nitrogen, an annealing temperature is 900° C., and an annealing time is 20 min;

S9, RCA cleaning: using a chain HF machine to remove wraparound oxide layer on the front side of the silicon wafer during the deposition of steps S4 to S7 and an oxide layer formed during annealing of step S8, and then using an alkali pickling machine to remove wraparound deposition layer on the front side of the silicon wafer;

S10, depositing an aluminum oxide film and a silicon nitride film on the front side of the silicon wafer: depositing an aluminum oxide ($AlO_x$) film by a PEALD method or a PECVD method for passivation, and an silicon nitride ($SiN_x$) film by a PECVD method for anti-reflection;

S11, depositing a silicon nitride film on the back side by PECVD: depositing a $SiN_x$ film by PECVD and the $SiN_x$ film being used for hydrogen passivation on the back side;

S12, preparing electrodes: screen-printing a slurry on the front side and the back side of the silicon wafer to form electrodes; and S13, electric injection, testing a conversion efficiency and sorting.

Example 2

A method for preparing a solar cell in Example 2 is substantially the same as that of the method in Example 1, the difference is in that:

in step S5, performing a hydrogen gas plasma treatment by introducing $H_2$ is omitted, and an intrinsic amorphous silicon layer with a thickness of 20 nm is directly formed.

Example 3

A method for preparing a solar cell in Example 3 is substantially the same as that of the method in Example 1, the difference is in that:

in step S6, performing a hydrogen gas plasma treatment by introducing $H_2$ is omitted, and an N-type doped amorphous silicon layer with a thickness of 100 nm is directly formed.

Example 4

A method for preparing a solar cell in Example 4 is substantially the same as that of the method in Example 1, the difference is in that:

in step S5, repeating the steps of depositing an intrinsic amorphous silicon preformed layer with a thickness of 4 nm and performing a hydrogen gas plasma treatment on the intrinsic amorphous silicon preformed layer by introducing $H_2$ for 5 times to obtain the intrinsic amorphous silicon layer.

Example 5

A method for preparing a solar cell in Example 5 is substantially the same as that of the method in Example 1, the difference is in that:

in step S5, depositing an intrinsic amorphous silicon preformed layer with a thickness of 20 nm and performing a hydrogen gas plasma treatment on the intrinsic amorphous silicon preformed layer by introducing $H_2$ to obtain the intrinsic amorphous silicon layer, i.e. the preset process includes one cycle period.

Example 6

A method for preparing a solar cell in Example 6 is substantially the same as that of the method in Example 1, the difference is in that:

in step S5, repeating the steps of depositing an intrinsic amorphous silicon preformed layer with a thickness of 1 nm and performing a hydrogen gas plasma treatment on the intrinsic amorphous silicon preformed layer by introducing $H_2$ for 20 times to obtain the intrinsic amorphous silicon layer.

Example 7

A method for preparing a solar cell in Example 7 is substantially the same as that of the method in Example 1, the difference is in that:

in step S6, repeating the steps of depositing an N-type doped amorphous silicon preformed layer with a thickness of 10 nm and performing a hydrogen gas plasma treatment on the N-type doped amorphous silicon preformed layer by introducing $H_2$ for 10 times to obtain the N-type doped amorphous silicon layer.

Example 8

A method for preparing a solar cell in Example 8 is substantially the same as that of the method in Example 1, the difference is in that:

in step S6, depositing an N-type doped amorphous silicon preformed layer with a thickness of 100 nm and performing a hydrogen gas plasma treatment on the N-type doped amorphous silicon preformed layer by introducing $H_2$ to obtain the N-type doped amorphous silicon layer, i.e. the preset process includes one cycle period.

Example 9

A method for preparing a solar cell in Example 9 is substantially the same as that of the method in Example 1, the difference is in that:

in step S6, repeating the steps of depositing an N-type doped amorphous silicon preformed layer with a thickness of 2 nm and performing a hydrogen gas plasma treatment on the N-type doped amorphous silicon preformed layer by introducing $H_2$ for 50 times to obtain the N-type doped amorphous silicon layer.

Example 10

A method for preparing a solar cell in Example 10 is substantially the same as that of the method in Example 1, the difference is in that:

in step S5 and step S6, both performing a hydrogen gas plasma treatment by introducing $H_2$ with a flow rate of 5000 sccm.

Example 11

A method for preparing a solar cell in Example 11 is substantially the same as that of the method in Example 1, the difference is in that:

in step S5 and step S6, both performing a hydrogen gas plasma treatment by introducing $H_2$ with a flow rate of 3000 sccm.

Example 12

A method for preparing a solar cell in Example 12 is substantially the same as that of the method in Example 1, the difference is in that:

in step S5 and step S6, both performing a hydrogen gas plasma treatment by introducing $H_2$ with a flow rate of 10000 sccm.

Example 13

A method for preparing a solar cell in Example 13 is substantially the same as that of the method in Example 1, the difference is in that:

in step S5 and step S6, both performing a hydrogen gas plasma treatment for 30 seconds by introducing $H_2$.

Comparative Example 1

A method for preparing a solar cell in Comparative Example 1 is substantially the same as that of the method in Example 1, the difference is in that:

in step S5, performing a hydrogen gas plasma treatment by introducing $H_2$ is omitted, and an intrinsic amorphous silicon layer with a thickness of 20 nm is directly formed; and in step S6, performing a hydrogen gas plasma treatment by introducing $H_2$ is omitted, and an N-type doped amorphous silicon layer with a thickness of 100 nm is directly formed.

Test

The obtained solar cells of examples and comparative example 1 are tested for electrical performance, and the test result is shown in Table 1. Eta represents an Auger recombination, Voc represents an open circuit voltage, Isc represents a short-circuit current, and FF represents a fill factor.

TABLE 1

Electrical performance of solar cells

| Project | Eta (%) | Voc (mV) | Isc (A) | FF (%) |
|---|---|---|---|---|
| Example 1 | 24.38 | 714.9 | 18.03 | 83.42 |
| Example 2 | 24.33 | 713.9 | 18.02 | 83.39 |
| Example 3 | 24.35 | 714.7 | 18.03 | 83.32 |
| Example 4 | 24.35 | 714.6 | 18.02 | 83.38 |
| Example 5 | 24.33 | 714.3 | 18.02 | 83.37 |
| Example 6 | 24.37 | 714.5 | 18.03 | 83.44 |
| Example 7 | 24.36 | 714.7 | 18.03 | 83.36 |
| Example 8 | 24.35 | 714.7 | 18.04 | 83.29 |
| Example 9 | 24.38 | 715 | 18.03 | 83.39 |
| Example 10 | 24.36 | 714.9 | 18.03 | 83.33 |
| Example 11 | 24.28 | 713.2 | 18.03 | 83.27 |
| Example 12 | 24.27 | 712.9 | 18.02 | 83.31 |
| Example 13 | 24.37 | 714.8 | 18.02 | 83.45 |
| Comparative Example 1 | 24.26 | 713.1 | 18.02 | 83.25 |

As shown in Table 1, the solar cells provided in Examples 1 to 7 have better overall electrical performance.

Compared to Comparative Example 1, the solar cell in Example 1 has an Eta increased by 0.12%, a Voc increased by 1.8 my, an equivalent Isc, and a FF increased by 0.17%.

Compared to Comparative Example 1, the solar cell in Example 2 has an Eta increased by 0.07%, a Voc increased by 0.8 my, an equivalent Isc, and a FF increased by 0.14%.

Compared to Comparative Example 1, the solar cell in Example 3 has an Eta increased by 0.09%, a Voc increased by 1.6 mV, an equivalent Isc, and a FF increased by 0.07%.

Compared to Comparative Example 1, the solar cell in Example 4 has an Eta increased by 0.09%, a Voc increased by 1.5 my, an equivalent Isc, and a FF increased by 0.13%.

Compared to Comparative Example 1, the solar cell in Example 5 has an Eta increased by 0.07%, a Voc increased by 1.2 mV, an equivalent Isc, and a FF increased by 0.12%.

Compared to Comparative Example 1, the solar cell in Example 6 has an Eta increased by 0.11%, a Voc increased by 1.4 mV, an equivalent Isc, and a FF increased by 0.19%.

Compared to Comparative Example 1, the solar cell in Example 7 has an Eta increased by 0.1%, a Voc increased by 1.6 mV, an equivalent Isc, and a FF increased by 0.11%.

Compared to Comparative Example 1, the solar cell in Example 8 has an Eta increased by 0.09%, a Voc increased by 1.6 mV, an equivalent Isc, and a FF increased by 0.04%.

Compared to Comparative Example 1, the solar cell in Example 9 has an Eta increased by 0.12%, a Voc increased by 1.9 mV, an equivalent Isc, and a FF increased by 0.14%.

Compared to Comparative Example 1, the solar cell in Example 10 has an Eta increased by 0.1%, a Voc increased by 1.8 mV, an equivalent Isc, and a FF increased by 0.08%.

Compared to Comparative Example 1, the solar cell in Example 11 has an Eta increased by 0.02%, a Voc increased by 0.1 mV, an equivalent Isc, and a FF increased by 0.02%.

Compared to Comparative Example 1, the solar cell in Example 12 has an Eta increased by 0.01%, a Voc decreased by 0.2 mV, an equivalent Isc, and a FF increased by 0.06%.

Compared to Comparative Example 1, the solar cell in Example 13 has an Eta increased by 0.12%, a Voc increased by 1.7 mV, an equivalent Isc, and a FF increased by 0.2%.

According to Examples 1 to 7, and Table 1, it is shown that: Compared to Example 1, the method for preparing the solar cell in Example 2 does not include a step of performing a hydrogen gas plasma treatment on the intrinsic amorphous silicon preformed layer, and Eta, Voc, and FF of the solar cell in Example 2 are all reduced to a certain extent.

Compared to Example 1, the method for preparing the solar cell in Example 3 does not include a step of performing a hydrogen gas plasma treatment on the N-type doped amorphous silicon preformed layer, and Eta, Voc, and FF of the solar cell in Example 3 are all reduced to a certain extent.

Compared to Example 3, the method for preparing the solar cell in Example 2 includes a step of performing a hydrogen gas plasma treatment on the N-type doped amorphous silicon preformed layer. Compared to Example 2, the method for preparing the solar cell in Example 3 includes a step of performing a hydrogen gas plasma treatment on the intrinsic amorphous silicon preformed layer. Eta, Voc, and FF of the solar cell in Example 3 are improved much more. It indicates that the enhancement effect of performing a hydrogen gas plasma treatment on the intrinsic amorphous silicon layer is better than that of performing a hydrogen gas plasma treatment on the N-type doped amorphous silicon layer.

Comparing Examples 4 and 5 with Example 1, it is shown that a thickness of the intrinsic amorphous silicon preformed layer performed a hydrogen gas plasma treatment in each cycle period of Examples 4 and 5 is greater than that of the intrinsic amorphous silicon preformed layer performed a hydrogen gas plasma treatment in Example 1. Comparing Examples 7 and 8 with Example 1, it is shown that a thickness of the N-type doped amorphous silicon preformed layer performed a hydrogen gas plasma treatment in each cycle periods of Examples 7 and 8 is greater than that of the N-type doped amorphous silicon preformed layer performed a hydrogen gas plasma treatment in Example 1. Compared to Example 1, Eta, Voc, and FF of the solar cells in Examples 4, 5, 7 and 8 are all reduced to a certain extent.

Comparing Example 5 with Example 4, a thickness of the intrinsic amorphous silicon preformed layer performed a hydrogen gas plasma treatment in each cycle period of Example 5 is greater than that of the intrinsic amorphous silicon preformed layer performed a hydrogen gas plasma treatment in Example 4. Compared to Example 4, Eta and Voc of the solar cell in Example 5 are both reduced to a certain extent and FF of the solar cell in Example 5 substantially remains unchanged.

Comparing Example 8 with Example 7, a thickness of the N-type doped amorphous silicon preformed layer performed a hydrogen gas plasma treatment in each cycle period of Example 8 is greater than that of the N-type doped amorphous silicon preformed layer performed a hydrogen gas plasma treatment in Example 7. Compared to Example 7, FF of the solar cell in Example 8 is reduced to a certain extent.

Comparing Example 6 with Example 1, a thickness of the intrinsic amorphous silicon preformed layer performed a hydrogen gas plasma treatment in each cycle period of Example 6 is less than that of the intrinsic amorphous silicon preformed layer performed a hydrogen gas plasma treatment in Example 1, the number of repeating times of performing a hydrogen gas plasma treatment in Example 6 is greater than that of repeating times of performing a hydrogen gas plasma treatment in Example 1. Compared to Example 1, FF of the solar cell obtained in Example 6 is limited, and Voc of the solar cell obtained in Example 6 is reduced to a certain extent. It is mainly because a thickness of the intrinsic amorphous silicon preformed layer performed a hydrogen gas plasma treatment in each cycle period is 1 nm, which is relatively thinner, in a hydrogen gas plasma treatment, the intrinsic amorphous silicon preformed layer may be destroyed, generating a defect and reducing Voc.

Comparing Example 9 with Example 1, a thickness of the N-type doped amorphous silicon preformed layer performed a hydrogen gas plasma treatment in each cycle period of Example 9 is less than that of the N-type doped amorphous silicon preformed layer performed a hydrogen gas plasma treatment in Example 1, the number of repeating times of performing a hydrogen gas plasma treatment in Example 9 is greater than that of repeating times of performing a hydrogen gas plasma treatment in Example 1. Compared to Example 1, Eta, Voc, Isc, and FF of the solar cell obtained in Example 9 are substantially unchanged.

Comparing Examples 10, 11 with Example 1, a flow rate of $H_2$ introduced in a step of performing a hydrogen gas plasma treatment of Examples 10 and 11 is less than that of $H_2$ introduced in a step of performing a hydrogen gas plasma treatment of Example 1. Compared to Example 1, FF of the solar cell obtained in Example 10 decreases to a certain extent.

A flow rate of $H_2$ introduced in a step of performing a hydrogen gas plasma treatment of Example 11 is relatively low. Compared to Comparative Example 1, Eta, Voc, Isc, and FF of the solar cell obtained in Example 11 do not increase obviously.

A flow rate of $H_2$ introduced in a step of performing a hydrogen gas plasma treatment of Example 12 is relatively high. Compared to Comparative Example 1, Eta, Voc, Isc, and FF of the solar cell obtained in Example 12 do not increase obviously, and Voc of the solar cell obtained in Example 12 even decreases. The reason is that the flow rate of $H_2$ introduced exceeds the preferred range, which negatively affects the electrical performance.

Comparing Example 13 with Example 1, a time of performing a hydrogen gas plasma treatment in each cycle period of Example 13 is longer than that of performing a hydrogen gas plasma treatment in each cycle period of Example 1. Compared to Example 1, Eta, Voc, and FF of the solar cell obtained in Example 13 are no longer effectively improved.

The foregoing described embodiments are some rather than all embodiments of the present disclosure. The detailed description of the embodiments of the present disclosure is not intended to limit the scope of the present disclosure as claimed, but merely to represent the selected embodiments of the present disclosure. Based on the embodiments of the present disclosure, all other embodiments obtained by a person of ordinary skill in the art without creative efforts fall within the protection scope of the present disclosure.

INDUSTRIAL PRACTICALITY

An embodiment of the present disclosure provides a solar cell and a preparation method thereof. The method includes forming an amorphous silicon layer by using a preset process, and then performing an annealing treatment to convert the amorphous silicon layer into a polycrystalline silicon layer. In the preset process, after depositing a target amorphous silicon preformed layer with a preset thickness, a hydrogen gas plasma treatment is performed on the target amorphous silicon preformed layer, which can improve a disordered microstructure in the deposited target amorphous silicon preformed layer, thereby effectively improving a crystallization rate of converting amorphous silicon into polycrystalline silicon, improving field passivation performance and contact performance of the solar cell, and further improving a Voc and a FF of the solar cell effectively. In the preset process, at least one cycle period is designed. When the preset process includes a plurality of cycle periods, to form a target amorphous silicon layer, deposition of the target amorphous silicon layer is interrupted for a plurality of times and a hydrogen gas plasma treatment is performed, which facilitates more hydrogen atoms entering the amorphous silicon, and can better combine a hydrogen atom with a suspended bond, and better improve a disordered microstructure in the amorphous silicon. In an embodiment in which an intrinsic amorphous silicon layer is formed on a surface of the tunneling oxide layer using the preset process, when the hydrogen gas plasma treatment is performed on the intrinsic amorphous silicon layer, hydrogen atoms can also easily enter an interface between a silicon wafer and a tunneling oxide layer, so that a large quantity of silicon suspension bonds at the interface can be saturated, thereby improving passivation performance of the solar cell and further improving a Voc and a FF of the solar cell effectively.

In addition, it may be understood that the solar cell provided in this embodiment of the present disclosure and a preparation method thereof may be reproduced, and may be used in multiple industrial applications. For example, the solar cell provided in this embodiment of the present disclosure and a preparation method thereof may be used in the technical field in the solar cell field.

What is claimed is:

1. A method for preparing a solar cell, comprising:

forming a target amorphous silicon layer on a side of a silicon wafer using a preset process, and then performing an annealing treatment on the target amorphous silicon layer to convert the target amorphous silicon layer into a target polycrystalline silicon layer, wherein the preset process comprises at least one cycle period, the at least one cycle period comprises: depositing a target amorphous silicon preformed layer with a preset thickness and performing a hydrogen gas plasma treatment on the target amorphous silicon preformed layer, wherein the preset thickness of the target amorphous silicon preformed layer is less than or equal to a thickness of the target amorphous silicon layer.

2. The method of claim 1, wherein the method comprises:

first growing a tunneling oxide layer on the back side of the silicon wafer;

forming an intrinsic amorphous silicon layer on a surface of the tunneling oxide layer using the preset process;

forming an N-type doped amorphous silicon layer on a surface of the intrinsic amorphous silicon layer using the preset process; and performing the annealing treatment.

3. The method of claim 2, wherein in a step of forming the intrinsic amorphous silicon layer on the surface of the tunneling oxide layer using the preset process, at least one of the following conditions (a) and (b) is met:

(a) the preset process comprises a plurality of cycle periods, the number of the plurality of cycle periods is in a range of 1 to 10; and (b) a thickness of the intrinsic amorphous silicon layer is less than or equal to 50 nm, and a preset thickness of the intrinsic amorphous silicon preformed layer is in a range of 2 nm to 50 nm.

4. The method of claim 3, wherein in the step of forming the intrinsic amorphous silicon layer on the surface of the tunneling oxide layer using the preset process, the following condition is met:

the number of the plurality of cycle periods is in a range of 5 to 10, the thickness of the intrinsic amorphous silicon layer is in a range of 20 nm to 50 nm, and the preset thickness of the intrinsic amorphous silicon preformed layer is in a range of 2 nm to 4 nm.

5. The method of claim 2, wherein a step of forming the N-type doped amorphous silicon layer on the surface of the intrinsic amorphous silicon layer comprises: forming the N-type doped amorphous silicon layer on the surface of the intrinsic amorphous silicon layer using the preset process.

6. The method of claim 5, wherein in the step of forming the N-type doped amorphous silicon layer on the surface of the intrinsic amorphous silicon layer using the preset process, at least one of the following conditions (a) and (b) is met:

(a) the preset process comprises a plurality of cycle periods, the number of the plurality of cycle periods is in a range of 1 to 20;

(b) a thickness of the N-type doped amorphous silicon layer is less than or equal to 200 nm, a preset thickness of an N-type doped amorphous silicon preformed layer is in a range of 2 nm to 200 nm.

7. The method of claim 6, wherein in the step of forming the N-type doped amorphous silicon layer on the surface of the intrinsic amorphous silicon layer using the preset process, the following condition is met:

the number of the plurality of cycle periods is in a range of 10 to 20, the thickness of the N-type doped amorphous silicon layer is in a range of 100 nm to 200 nm, and the preset thickness of the N-type doped amorphous silicon preformed layer is in a range of 5 nm to 10 nm.

8. The method of claim 2, wherein after a step of forming the N-type doped amorphous silicon layer and before performing the annealing treatment, the method further comprises: growing a $SiO_x$ mask layer on a surface of the N-type doped amorphous silicon layer.

9. The method of claim 1, wherein in a step of forming the target amorphous silicon layer on the back side of the silicon wafer using the preset process, the following condition is met:

in a step of performing a hydrogen gas plasma treatment on the target amorphous silicon preformed layer, a flow rate of hydrogen gas is greater than and equal to 1000 sccm, and a treatment time is in a range of 10 s to 60 s.

10. The method of claim 1, wherein in the step of forming the target amorphous silicon layer on the back side of the silicon wafer using the preset process, the following condition is met:

the at least one cycle period of the preset process comprises: depositing the target amorphous silicon preformed layer with the preset thickness using a plasma enhanced chemical vapor deposition method or a plasma enhanced physical vapor deposition method.

11. The method of claim 2, wherein a step of growing the tunneling oxide layer on the back side of the silicon wafer further comprises: growing the tunneling oxide layer with a thickness of 0.5 nm to 2 nm on the back side of the silicon wafer using a plasma enhanced chemical vapor deposition method or a plasma enhanced atomic layer deposition method.

12. The method of claim 2, wherein a step of forming the intrinsic amorphous silicon layer on the surface of the tunneling oxide layer using the preset process further comprises:

first introducing $SiH_4$ and $H_2$ using a plasma enhanced chemical vapor deposition method, depositing an intrinsic amorphous silicon film, then stopping introducing $SiH_4$ and $H_2$ and vacuuming;

performing a hydrogen gas plasma treatment by introducing $H_2$ and then vacuuming after the treatment; and repeating the above steps to obtain the intrinsic amorphous silicon layer.

13. The method of claim 2, wherein a step of forming the N-type doped amorphous silicon layer on the surface of the intrinsic amorphous silicon layer comprises:

first introducing $SiH_4$, $NH_3$, and $H_2$, depositing an N-type doped amorphous silicon film using a plasma enhanced chemical vapor deposition method, and then stopping introducing $SiH_4$, $NH_3$, and $H_2$ and vacuuming;

performing a hydrogen gas plasma treatment by introducing $H_2$ and then vacuuming after the treatment; and repeating the above steps to obtain the N-doped amorphous silicon layer.

14. The method of claim 1, wherein a step of performing an annealing treatment comprises performing an annealing treatment using a tubular annealing furnace to convert the target amorphous silicon layer into the target polycrystalline silicon layer, wherein an annealing gas atmosphere is nitrogen or oxygen, an annealing temperature is in a range of 600° C. to 1000° C., and an annealing time is in a range of 10 min to 60 min.

15. The method of claim 1, wherein the preset process comprises a plurality of cycle periods and the preset thickness of the target amorphous silicon preformed layer in each of the plurality of cycle periods is the same.

16. The method of claim 1, wherein the preset process comprises a plurality of cycle periods and the preset thickness of the target amorphous silicon preformed layer in each of the plurality of cycle periods is different.

17. A solar cell, prepared by the method of claim 1.

* * * * *